(12) United States Patent
Ooyabu et al.

(10) Patent No.: US 8,877,528 B2
(45) Date of Patent: Nov. 4, 2014

(54) PRODUCING METHOD OF LIGHT EMITTING ELEMENT TRANSFER SHEET, PRODUCING METHOD OF LIGHT EMITTING DEVICE, LIGHT EMITTING ELEMENT TRANSFER SHEET, AND LIGHT EMITTING DEVICE

(75) Inventors: Yasunari Ooyabu, Osaka (JP); Toshiki Naito, Osaka (JP); Satoshi Sato, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/446,611

(22) Filed: Apr. 13, 2012

(65) Prior Publication Data

US 2012/0261681 A1    Oct. 18, 2012

(30) Foreign Application Priority Data

Apr. 14, 2011    (JP) .................................. 2011-89965

(51) Int. Cl.
*H01L 21/00* (2006.01)
*H01L 33/56* (2010.01)
*H01L 33/46* (2010.01)
*H01L 33/00* (2010.01)

(52) U.S. Cl.
CPC ............. *H01L 33/56* (2013.01); *H01L 33/0095* (2013.01); *H01L 2933/005* (2013.01); *H01L 2933/006* (2013.01); *H01L 33/46* (2013.01)
USPC ................... 438/27; 257/88; 257/98; 257/99; 257/E33.061; 257/E33.072

(58) Field of Classification Search
USPC ......... 257/98, 88, E33.061, E33.072; 438/27, 438/33; 359/838
See application file for complete search history.

(56) References Cited

U.S. PATENT DOCUMENTS

2005/0139851 A1    6/2005   Sato
2006/0118510 A1    6/2006   Fujii
(Continued)

FOREIGN PATENT DOCUMENTS

JP    2002-261325 A    9/2002
JP    2005-005604 A    1/2005
(Continued)

OTHER PUBLICATIONS

Communication dated May 20, 2014, issued by the Japanese Patent Office in corresponding Application No. 2011-089965.
(Continued)

*Primary Examiner* — Marvin Payen
*Assistant Examiner* — Victor Barzykin
(74) *Attorney, Agent, or Firm* — Sughrue Mion, PLLC (57) ABSTRACT

A method for producing a light emitting transfer sheet includes the steps of preparing a light emitting element sheet including a light semiconductor layer connected to an electrode portion on one side surface and a phosphor layer laminated on the other side surface; dividing the light emitting element sheet into plural pieces to form a plurality of light emitting elements; disposing a plurality of the light emitting elements on a substrate to be spaced apart from each other; forming a reflecting resin layer containing a light reflecting component on the substrate so as to cover the light emitting elements; and removing the reflecting resin layer partially so that one side surface of the electrode portion is exposed from the reflecting resin layer.

4 Claims, 3 Drawing Sheets

(56) References Cited

U.S. PATENT DOCUMENTS

| | | | |
|---|---|---|---|
| 2008/0173884 A1 | 7/2008 | Chitnis et al. | |
| 2008/0191620 A1* | 8/2008 | Moriyama et al. | 313/506 |
| 2010/0051984 A1* | 3/2010 | West | 257/98 |
| 2010/0264438 A1* | 10/2010 | Suenaga | 257/98 |
| 2010/0320479 A1 | 12/2010 | Minato et al. | |
| 2011/0147774 A1* | 6/2011 | Wang et al. | 257/98 |
| 2011/0266569 A1* | 11/2011 | Basin et al. | 257/98 |
| 2012/0153328 A1* | 6/2012 | Tsutsui | 257/98 |
| 2012/0248485 A1* | 10/2012 | Shinbori et al. | 257/98 |
| 2012/0261699 A1* | 10/2012 | Ooyabu et al. | 257/98 |
| 2012/0261700 A1* | 10/2012 | Ooyabu et al. | 257/98 |
| 2012/0262054 A1* | 10/2012 | Ooyabu et al. | 313/498 |
| 2012/0305969 A1* | 12/2012 | Sato et al. | 257/98 |
| 2013/0001605 A1* | 1/2013 | Ishihara et al. | 257/88 |
| 2013/0069525 A1* | 3/2013 | Imai | 313/512 |

FOREIGN PATENT DOCUMENTS

| | | |
|---|---|---|
| JP | 2005-191420 A | 7/2005 |
| JP | 2012-079776 A | 4/2012 |
| JP | 2012-084622 A | 4/2012 |
| JP | 2012-124443 A | 6/2012 |
| WO | 2009/069671 A1 | 6/2009 |
| WO | 2009/126272 A1 | 10/2009 |

OTHER PUBLICATIONS

European Search Report dated Aug. 4, 2014 in European Patent Application No. 12161745.0.

* cited by examiner

PRODUCING METHOD OF LIGHT EMITTING ELEMENT TRANSFER SHEET, PRODUCING METHOD OF LIGHT EMITTING DEVICE, LIGHT EMITTING ELEMENT TRANSFER SHEET, AND LIGHT EMITTING DEVICE

CROSS-REFERENCE TO RELATED APPLICATION

The present application claims priority from Japanese Patent Application No. 2011-089965 filed on Apr. 14, 2011, the contents of which are hereby incorporated by reference into this application.

BACKGROUND OF THE INVENTION

1. Field of the Invention

The present invention relates to a producing method of a light emitting element transfer sheet, a producing method of a light emitting device, a light emitting element transfer sheet, and a light emitting device, to be specific, to a producing method of a light emitting element transfer sheet and a light emitting element transfer sheet obtained by the method, and a producing method of a light emitting device and a light emitting device obtained by the method.

2. Description of Related Art

In recent years, as a light emitting device that is capable of emitting high-energy light, a white light emitting device has been known. In the white light emitting device, for example, a diode board, an LED (light emitting diode) laminated thereon, emitting blue light, a phosphor layer that can convert the blue light into yellow light and covers the LED, and an encapsulating layer that encapsulates the LED are provided. The white light emitting device emits high-energy white light by color mixing of the blue light emitted from the LED, which is encapsulated by the encapsulating layer and to which electric power is supplied from the diode board, transmitting through the encapsulating layer and the phosphor layer, and the yellow light that is converted in wavelength from a part of the blue light in the phosphor layer.

As a method for producing the white light emitting device, for example, the following method has been proposed (ref: for example, Japanese Unexamined Patent Publication No. 2005-191420).

The proposed method is as follows. That is, a base, which has a board portion and a white reflecting frame portion protruding from the circumference portion thereof toward the upper side, is first formed. Next, a semiconductor light emitting element is subjected to a wire bonding in a bottom portion of a concave portion, which is formed at the center of the board portion by the reflecting frame portion, so as to be spaced apart from the inner side of the reflecting frame portion.

Next, a mixture of a phosphor and an epoxy resin in a liquid state is filled in the concave portion by application, subsequently the phosphor is spontaneously precipitated in the bottom portion of the concave portion, and then the epoxy resin is heat cured.

In the white light emitting device obtained by the method proposed in Japanese Unexamined Patent Publication No. 2005-191420, the phosphor layer (a wavelength conversion layer) that contains the phosphor formed by a precipitation at high concentrations is defined in a region at the upper side of the semiconductor light emitting element and an encapsulating portion that contains the epoxy resin at high concentrations is defined in a region at the upper side of the phosphor layer.

In the white light emitting device, the semiconductor light emitting element radially emits the blue light. Of the emitted blue light, a part thereof emitted from the semiconductor light emitting element toward the upper side is converted into the yellow light in the phosphor layer and the remaining light transmits through the phosphor layer. The blue light emitted from the semiconductor light emitting element toward the side is reflected at the reflecting frame portion and then toward the upper side. The white light emitting device in Japanese Unexamined Patent Publication No. 2005-191420 emits the white light by color mixing of the blue light and the yellow light.

SUMMARY OF THE INVENTION

However, in the white light emitting device obtained by the producing method in Japanese Unexamined Patent Publication No. 2005-191420, the semiconductor light emitting element is spaced apart from the reflecting frame portion, so that a part of the light emitted from the semiconductor light emitting element toward the side is absorbed in the encapsulating portion before being reflected at the reflecting frame portion. As a result, there is a disadvantage that extraction efficiency of the light is reduced.

It is an object of the present invention to provide a light emitting element transfer sheet that is capable of improving extraction efficiency of light in a light emitting device and a producing method thereof, and the light emitting device obtained by using the light emitting element transfer sheet and a producing method thereof.

The method for producing a light emitting element transfer sheet of the present invention includes the steps of preparing a light emitting element sheet including a light semiconductor layer connected to an electrode portion on one side surface in a thickness direction thereof and a phosphor layer laminated on the other side surface in the thickness direction of the light semiconductor layer; dividing the light emitting element sheet into plural pieces to form a plurality of light emitting elements, each of which includes the electrode portion, the light semiconductor layer, and the phosphor layer; disposing a plurality of the light emitting elements on a substrate to be spaced apart from each other so that the phosphor layer is opposed to the substrate; forming a reflecting resin layer containing a light reflecting component on the substrate so as to cover the light emitting elements; and removing the reflecting resin layer partially so that one side surface in the thickness direction of the electrode portion is exposed from the reflecting resin layer.

The method for producing a light emitting device of the present invention includes the steps of producing a light emitting element transfer sheet by the above-described method for producing the light emitting element transfer sheet; dividing the light emitting element transfer sheet into a plurality of single pieces, each of which includes at least one piece of the light emitting element; and allowing the single piece to be disposed in opposed relation to a base board including a terminal in a thickness direction, and the electrode portion to be electrically connected to the terminal, so that the light emitting element is flip-chip mounted on the base board.

A light emitting element transfer sheet of the present invention includes a substrate; a plurality of light emitting elements including a light semiconductor layer, an electrode portion connected to one side surface in a thickness direction of the light semiconductor layer, and a phosphor layer laminated on the other side surface in the thickness direction of the light semiconductor layer disposed on the substrate to be spaced apart from each other so that the phosphor layer is opposed to the substrate; and a reflecting resin layer containing a light reflecting component and on the substrate, covering the light emitting elements and exposing one side surface in the thickness direction of the electrode portion.

A light emitting device of the present invention allows a single piece obtained by dividing the above-described light emitting element transfer sheet into plural pieces, including at least one piece of a light emitting element, to be disposed in opposed relation to a base board including a terminal in a thickness direction, and an electrode portion to be electrically connected to the terminal, so that the light emitting element is flip-chip mounted on the base board.

In the method for producing the light emitting element transfer sheet of the present invention and the light emitting element transfer sheet of the present invention obtained by the method, the reflecting resin layer that contains the light reflecting component is formed so as to cover the light emitting element.

Therefore, in the method for producing the light emitting device using the light emitting element transfer sheet and the light emitting device obtained by the method, light emitted from the light semiconductor layer is reflected by the light reflecting component of the reflecting resin layer before being absorbed by another member. As a result, extraction efficiency of the light can be improved.

BRIEF DESCRIPTION OF THE DRAWINGS

FIG. 2 shows a sectional view of one embodiment of a light emitting element transfer sheet of the present invention:

(a) illustrating the light emitting element transfer sheet before being divided and (b) illustrating the light emitting element transfer sheet at the time of being divided.

FIG. 3 shows process drawings for illustrating a method for producing the light emitting element transfer sheet shown in FIG. 2:

(a) illustrating a step of preparing a light emitting element sheet, (b) illustrating a step of disposing light emitting elements obtained by dividing the light emitting element sheet on a release substrate, (c) illustrating a step of forming a reflecting resin layer so as to cover the light emitting elements, and (d) illustrating a step of removing the reflecting resin layer partially.

FIG. 4 shows process drawings for illustrating a method for producing the light emitting device shown in FIG. 1:

(a) illustrating a step of producing the light emitting element transfer sheet, (b) illustrating a step of dividing the light emitting element transfer sheet into single pieces, (c) illustrating a step of allowing the light emitting element to be flip-chip mounted on a diode board, and (d) illustrating a step of releasing the release substrate from the light emitting element.

DETAILED DESCRIPTION OF THE INVENTION

Figure 1:
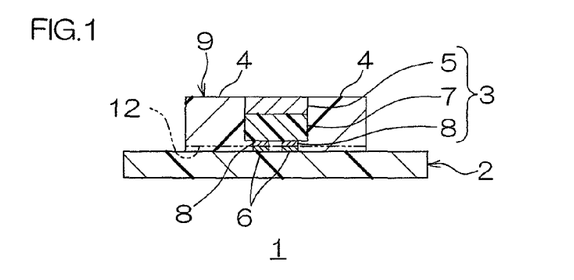
FIG. 1 shows a sectional view of one embodiment of a light emitting device of the present invention.
Figure 2:
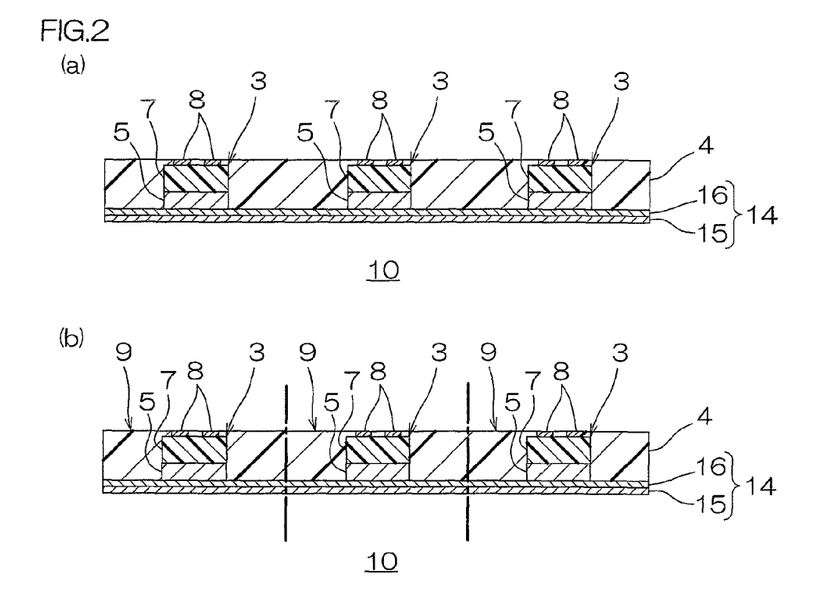

FIG. 1 shows a sectional view of one embodiment of a light emitting device of the present invention. FIG. 2 shows a sectional view of one embodiment of a light emitting element transfer sheet of the present invention: (a) illustrating the light emitting element transfer sheet before being divided and (b) illustrating the light emitting element transfer sheet at the time of being divided.

In FIG. 1, a light emitting diode device 1, as a light emitting device, includes a diode board 2, as a base board, and a single piece 9 including a light emitting element 3 to be described later.

The diode board 2 is formed into a generally flat plate shape. To be specific, the diode board 2 is formed of a laminated plate in which a conductive layer, as a circuit pattern, is laminated on an insulating board. The insulating board is formed of, for example, a silicon board, a ceramic board, a polyimide resin board, or the like. Preferably, the insulating board is formed of the ceramic board, to be specific, a sapphire ($Al_2O_3$) board. The conductive layer is formed of, for example, a conductor such as gold, copper, silver, or nickel. The conductors can be used alone or in combination.

The conductive layer includes a terminal 6.

The terminals 6 are formed at spaced intervals in a plane direction on the upper surface of the insulating board and are formed into a pattern corresponding to electrode portions 8 to be described later. Although not shown, the terminal 6 is electrically connected to an electric power supply portion via the conductive layer.

The single piece 9 includes at least one piece (one piece in FIG. 1) of the light emitting element 3 that is flip-chip mounted on the diode board 2 and a reflecting resin layer 4 that is provided at the lateral side of the light emitting element 3.

The light emitting element 3 includes a light semiconductor layer 7, the electrode portion 8 that is connected to one side surface (the back surface (the lower surface in FIG. 1)) in a thickness direction of the light semiconductor layer 7, and a phosphor layer 5 that is laminated on the other side surface (the top surface (the upper surface in FIG. 1)) in the thickness direction thereof.

Although not shown, for example, the light semiconductor layer 7 includes a buffer layer, an N-type semiconductor layer, a light emitting layer, and a P-type semiconductor layer that are sequentially laminated in the thickness direction. The light semiconductor layer 7 is formed of a known semiconductor material and is formed by a known growth method such as an epitaxial growth method. The light semiconductor layer 7 has a thickness in the range of, for example, 0.1 to 500 µm, or preferably 0.2 to 200 µm.

The electrode portion 8 is electrically connected to the light semiconductor layer 7 and is formed so as to be included in the light semiconductor layer 7 when projected in the thickness direction. The electrode portion 8 includes, for example, an anode electrode that is connected to the P-type semiconductor layer and a cathode electrode that is formed in the N-type semiconductor layer.

The electrode portion 8 is formed of a known conductive material and has a thickness in the range of, for example, 10 to 1000 nm.

The phosphor layer 5 is formed on the entire surface of the other side surface (the top surface (the upper surface in FIG. 1) in the thickness direction of the light semiconductor layer 7 and is formed into a generally rectangular shape in plane view having the same pattern as that of the outer shape of the light semiconductor layer 7 when projected in the thickness direction.

The phosphor layer 5 is formed of, for example, a phosphor composition that contains a phosphor.

Preferably, the phosphor composition contains the phosphor and a resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include garnet type phosphor having a garnet type crystal structure such as $Y_3Al_5O_{12}$:Ce (YAG (yttrium aluminum garnet):Ce), $(Y, Gd)_3Al_5O_{12}$:Ce, $Tb_3Al_3O_{12}$:Ce, $Ca_3Sc_2Si_3O_{12}$:Ce, and $Lu_2CaMg_2(Si, Ge)_3O_{12}$:Ce; silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$:Mn and $SrAl_2O_4$:Eu; sulfide phosphor such as ZnS:Cu,Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlON; nitride phosphor such as $CaAlSiN_3$:Eu and $CaSi_5N_8$:Eu; and fluoride-based phosphor such as $K_2SiF_6$:Mn and $K_2TiF_6$:Mn. Preferably, garnet type phosphor is used, or more preferably, $Y_3Al_5O_{12}$:Ce (YAG) is used.

The phosphors can be used alone or in combination of two or more.

The mixing ratio of the phosphor is, for example, 1 to 50 mass %, or preferably 5 to 30 mass % with respect to the phosphor composition. The mixing ratio of the phosphor is, for example, 1 to 100 parts by mass, or preferably 5 to 40 parts by mass per 100 parts by mass of a resin.

The resin is a matrix in which the phosphor is dispersed, including, for example, transparent resins such as silicone resin, epoxy resin, and acrylic resin. Preferably, the silicone resin is used from the viewpoint of durability.

The silicone resin has, in its molecule, a main chain mainly composed of the siloxane bond (—Si—O—Si—) and a side chain, which is bonded to silicon atoms (Si) of the main chain, composed of an organic group such as an alkyl group (for example, a methyl group and the like) or an alkoxyl group (for example, a methoxy group).

To be specific, examples of the silicone resin include dehydration condensation type silicone resin, addition reaction type silicone resin, peroxide curable silicone resin, moisture curable silicone resin, and curable silicone resin. Preferably, the addition reaction type silicone resin is used.

The silicone resin has a kinetic viscosity at 25° C. in the range of, for example, 10 to 30 $mm^2$/s.

The resins can be used alone or in combination of two or more.

The mixing ratio of the resin is, for example, 50 to 99 mass %, or preferably 57 to 95 mass % with respect to the phosphor composition.

The phosphor and the resin are blended at the above-described mixing ratio and are stirred and mixed, so that the phosphor composition is prepared.

The phosphor layer 5 has a thickness in the range of, for example, 0.1 to 1000 μm, or preferably 0.2 to 800 μm.

The thickness of the light emitting element 3 (the total thickness of the phosphor layer 5, the light semiconductor layer 7, and the electrode portion 8) is in the range of, for example, 20 to 500 μm, or preferably 50 to 300 μm.

The reflecting resin layer 4 is, on the upper surface of the diode board 2, in plane view, provided in a region other than the region where the light emitting element 3 is formed, to be specific, on the both outer sides in a right-left direction and the both outer sides in a front-rear direction of the light emitting element 3. The reflecting resin layer 4 is in close contact with each of the surfaces of the left surface, the right surface, the front surface, and the rear surface of the light emitting element 3. In this way, the reflecting resin layer 4 exposes the upper surface of the light emitting element 3.

The reflecting resin layer 4, for example, contains a light reflecting component. To be specific, the reflecting resin layer 4 is formed of a reflecting resin composition that contains a resin and the light reflecting component.

An example of the resin includes a thermosetting resin such as thermosetting silicone resin, epoxy resin, thermosetting polyimide resin, phenol resin, urea resin, melamine resin, unsaturated polyester resin, diallyl phthalate resin, and thermosetting urethane resin. Preferably, the thermosetting silicone resin or the epoxy resin is used.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaolin (kaolinite).

As the white inorganic pigment, preferably, the oxide is used or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is rutile, brookite (pyromelane), anatase (octahedrite), or the like. Preferably, the crystal structure thereof is rutile.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are rutile and the tetragonal system, respectively, it is possible to effectively prevent a reduction of the reflectance with respect to light (to be specific, visible light, among all, the light around the wavelength of 450 nm) even in a case where the reflecting resin layer 4 is exposed to a high temperature for a long time.

The light reflecting component is in the form of a particle. The shape thereof is not limited and examples of the shape thereof include, for example, a sphere shape, a plate shape, and a needle shape. An average value of the maximum length (in a case of the sphere shape, the average particle size) of the light reflecting component is in the range of, for example, 1 to 1000 nm. The average value of the maximum length is measured by using a laser diffraction scattering particle size analyzer.

The mixing ratio of the light reflecting component per 100 parts by mass of the resin is, for example, 0.5 to 90 parts by mass, or preferably 1.5 to 70 parts by mass from the viewpoint of the coloring characteristics and the light reflectivity.

The mixing ratio of the light reflecting component per 100 parts by mass of the reflecting resin composition is, for example, 0.5 to 90 parts by mass, or preferably 1.5 to 70 parts by mass from the viewpoint of the light reflectance and handling ability.

The above-described light reflecting component is uniformly dispersed and mixed into the resin.

In addition, a filler can further be added into the reflecting resin composition. That is, the filler can be used in combination with the light reflecting component (to be specific, the white pigment).

An example of the filler includes a known filler, except for the above-described white pigment. To be specific, an inorganic filler is used. Examples thereof include silica powder, talc powder, alumina powder, aluminum nitride powder, and silicon nitride powder.

Preferably, as the filler, the silica powder is used from the viewpoint of reducing a linear expansion coefficient of the reflecting resin layer 4.

Examples of the silica powder include fused silica powder and crystalline silica powder. Preferably, the fused silica powder (that is, silica glass powder) is used.

Examples of the shape of the filler include, for example, a sphere shape, a plate shape, and a needle shape. Preferably, the sphere shape is used from the viewpoint of excellent filling characteristics and fluidity.

Therefore, preferably, the fused silica powder in a sphere shape is used as the silica powder.

The average value of the maximum length (in a case of the sphere shape, the average particle size) of the filler is in the range of, for example, 5 to 60 μm, or preferably 15 to 45 μm. The average value of the maximum length is measured by using the laser diffraction scattering particle size analyzer.

The addition ratio of the filler is adjusted so that the total amount of the filler and the light reflecting component per 100 parts by mass of the resin is, for example, 10 to 80 parts by mass. And the addition ratio of the filler is adjusted so that the total amount of the filler and the light reflecting component per 100 parts by mass of the resin is preferably 25 to 75 parts by mass, or more preferably 40 to 60 parts by mass from the view point of reducing the linear expansion coefficient and ensuring the fluidity.

The addition ratio of the filler is adjusted so that the total amount of the filler and the light reflecting component per 100 parts by mass of the reflecting resin composition is preferably 1.5 to 70 parts by mass from the viewpoint of the light reflectance and the handling ability.

The above-described resin, light reflecting component, and filler, which is added as required, are blended to be uniformly mixed, so that the reflecting resin composition is prepared.

The reflecting resin composition is prepared in a B-stage state.

The reflecting resin composition is formed, for example, in a state of liquid or semi-solid and has a kinetic viscosity in the range of, for example, 10 to 30 mm$^2$/s.

In this way, the outer side surfaces of the light emitting element 3 are encapsulated by the reflecting resin layer 4.

As shown in phantom lines in FIG. 1, at the lower side of the light semiconductor layer 7, a lower space 12 corresponding to the thickness of the electrode portion 8 is formed.

The reflecting resin layer 4 is filled in the lower space 12 and in the lower space 12, the reflecting resin layer 4 is in close contact with the lower surface of the light semiconductor layer 7 exposed from the electrode portion 8 and the side surfaces of the electrode portion 8.

The thickness of the reflecting resin layer 4 is the same as that of the light emitting element 3 described above (the total thickness of the phosphor layer 5, the light semiconductor layer 7, and the electrode portion 8) and is, to be specific, in the range of, for example, 20 to 500 μm, or preferably 50 to 300 μm.

As shown in FIGS. 2 (a) and 2 (b), the above-described single pieces 9 can be obtained by dividing a light emitting element transfer sheet 10 into plural pieces.

The light emitting element transfer sheet 10 is a transfer sheet for transferring the light emitting element 3 (and the reflecting resin layer 4) onto the diode board 2 (ref: FIG. 1).

As described later, the light emitting element transfer sheet 10 is divided to form a plurality (for example, three pieces) of the single pieces 9.

The light emitting element transfer sheet 10 includes a release substrate 14 as a substrate, a plurality (for example, three pieces) of the light emitting elements 3 that are supported by the release substrate 14, and the reflecting resin layer 4 that covers the side surfaces of the light emitting elements 3.

To be specific, in the light emitting element transfer sheet 10, a plurality (for example, three pieces) of the light emitting elements 3 are, on the release substrate 14, disposed at spaced intervals to each other so that the phosphor layer 5 is opposed to the release substrate 14. As described above, on the release substrate 14, the reflecting resin layer 4 covers the light emitting elements 3 so that one side surface (the back surface (the upper surface in FIG. 2 (a)) in the thickness direction of the electrode portion 8 is exposed.

The release substrate 14 that supports the light emitting element 3 and the reflecting resin layer 4 is, for example, a release sheet (a release film) in a generally rectangular shape and the upper surface and the lower surface thereof are formed into a flat state.

The release substrate 14 is formed of a thermal release sheet that can be easily peeled off by being heated. The thermal release sheet includes a supporting layer 15 and a pressure-sensitive adhesive layer 16 that is laminated on the upper surface of the supporting layer 15.

The supporting layer 15 is formed of, for example, a heat resistant resin such as polyester.

The pressure-sensitive adhesive layer 16 is formed of, for example, a thermally expandable pressure-sensitive adhesive and the like, which has adhesion under normal temperature (25° C.), and in which the adhesion is reduced (or lost) at the time of being heated.

A commercially available product can be used as the above-described thermal release sheet. To be specific, REVALPHA (a trade name, manufactured by NITTO DENKO CORPORATION) and the like can be used.

The thermal release sheet reliably supports the single piece 9 (the light emitting element 3 and the reflecting resin layer 4) by the supporting layer 15 via the pressure-sensitive adhesive layer 16 and as described later, is peeled off from the single piece 9 (the light emitting element 3 and the reflecting resin layer 4) due to a reduction in the adhesion of the pressure-sensitive adhesive layer 16 by being heated.

The release substrate 14 is formed of a resin material and the like such as a vinyl polymer including polyolefin (to be specific, polyethylene and polypropylene) and ethylene-vinyl acetate copolymer (EVA); a polyester including polyethylene terephthalate and polycarbonate; and a fluorine resin including polytetrafluoroethylene. The release substrate 14 can be also formed of a metal material such as iron, aluminum, or stainless steel.

The release substrate 14 has a thickness in the range of, for example, 10 to 1000 μm.

Figure 3:
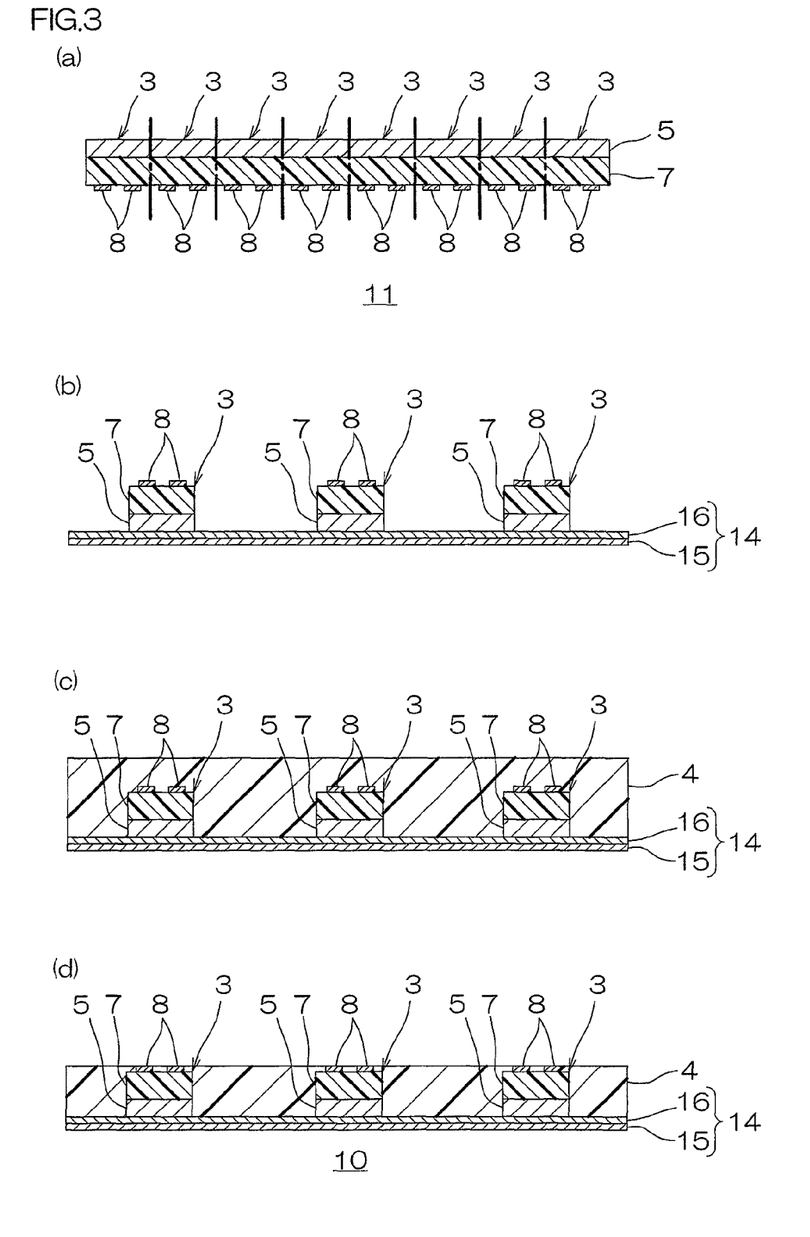

FIG. 3 shows process drawings for illustrating a method for producing the light emitting element transfer sheet shown in FIG. 2.

Next, a method for producing the light emitting element transfer sheet 10 described above is described with reference to FIG. 3.

In this method, as shown in FIG. 3 (a), a light emitting element sheet 11 is first prepared.

The light emitting element sheet 11 is an assembly sheet of the light emitting element 3, integrally including a plurality (for example, eight pieces) of the light emitting elements 3.

As described later, the light emitting element sheet 11 is divided to form a plurality (for example, eight pieces) of the light emitting elements 3.

To be specific, the light emitting element sheet 11 includes the light semiconductor layer 7 (a light semiconductor sheet) that is long in the plane direction in a sheet state, a plurality of the electrode portions 8 that are connected to one side surface (the back surface (the lower surface in FIG. 3 (a)) in the thickness direction of the light semiconductor layer 7 so as to correspond to each of the light emitting elements 3, and the phosphor layer 5 that is long in the plane direction in a sheet state laminated on the other side surface (the top surface (the upper surface in FIG. 3 (a)) in the thickness direction of the light semiconductor layer 7.

The light emitting element sheet 11 can be obtained as follows. For example, first, the above-described phosphor composition is formed into a sheet state that is long in the plane direction and is heated, for example, at 50 to 150° C. to be dried, so that the phosphor layer 5 is formed. Next, the light semiconductor layer 7 that is long in the plane direction in a sheet state is laminated on one side surface (the back surface (the lower surface in FIG. 3 (a)) in the thickness direction of the phosphor layer 5 by a known method. Thereafter, the electrode portion 8 is connected to one side surface (the back surface (the lower surface in FIG. 3 (a)) in the thickness direction of the light semiconductor layer 7.

Next, in this method, as shown in dashed lines in FIG. 3 (a), the light emitting element sheet 11 is divided into plural pieces to form a plurality (for example, eight pieces) of the light emitting elements 3, to be specific, the light emitting elements 3, each of which includes the electrode portion 8, the light semiconductor layer 7, and the phosphor layer 5.

A method for dividing the light emitting element sheet 11 is not particularly limited and a known method can be used.

A plurality (for example, eight pieces) of the light emitting elements 3 obtained by the above-described divide are turned over in an up-down direction in the next step (FIGS. 3 (b) to 3 (d)).

Next, in this method, as shown in FIG. 3 (b), a plurality (for example, three pieces) of the light emitting elements 3 are, on the release substrate 14, disposed at spaced intervals to each other so that the phosphor layer 5 of the light emitting element 3 is opposed to the release substrate 14.

A space between the light emitting elements 3 is not particularly limited and is set appropriately according to its purpose and use.

Next, in this method, as shown in FIG. 3 (c), the reflecting resin layer 4 is formed on the release substrate 14 so as to cover the light emitting elements 3.

A method for forming the reflecting resin layer 4 is not particularly limited. For example, the above-described reflecting resin composition is applied onto the release substrate 14 so as to cover the light emitting elements 3, for example, by an application method such as printing and dispenser.

Next, in this method, as shown in FIG. 3 (d), the reflecting resin layer 4 is partially removed by a known etching method or the like so that one side surface (the back surface (the upper surface in FIG. 3 (d)) in the thickness direction of the electrode portion 8 is exposed from the reflecting resin layer 4.

To be specific, the reflecting resin layer 4 is partially removed so that one side surface (the back surface (the upper surface in FIG. 3 (d)) in the thickness direction of the electrode portion 8 is flush with one side surface (the back surface (the upper surface in FIG. 3 (d)) in the thickness direction of the reflecting resin layer 4.

In this way, on the release substrate 14, the reflecting resin layer 4 is formed so as to cover the light emitting elements 3 and to expose one side surface (the back surface (the upper surface in FIG. 3 (d)) in the thickness direction of the electrode portion 8, and the light emitting element transfer sheet 10 can be produced.

In the method for producing the light emitting element transfer sheet 10 and the light emitting element transfer sheet 10 obtained by the method, the reflecting resin layer 4 that contains the light reflecting component is formed so as to cover the light emitting element 3.

Therefore, as described later, in the method for producing the light emitting diode device 1 using the light emitting element transfer sheet 10 and the light emitting diode device 1 obtained by the method, light emitted from the light semiconductor layer 7 is reflected by the light reflecting component of the reflecting resin layer 4 before being absorbed by another member. As a result, the extraction efficiency of the light can be improved.

In the method for producing the light emitting diode device 1 using the light emitting element transfer sheet 10 and the light emitting diode device 1 obtained by the method, the phosphor layer 5, which is formed in a sheet state, is prepared in advance, so that the phosphor layer 5 can be easily formed to be thin in a short time. Therefore, an increase in the production costs can be suppressed.

In the method for producing the light emitting diode device 1 using the light emitting element transfer sheet 10 and the light emitting diode device 1 obtained by the method, the reflecting resin layer 4 can be successfully filled in the lower space 12 at the lower side of the light semiconductor layer 7 by the reflecting resin layer 4.

In the method for producing the light emitting diode device 1 using the light emitting element transfer sheet 10 and the light emitting diode device 1 obtained by the method, the light emitting element 3 can be encapsulated by the reflecting resin layer 4, so that it is not required that the light emitting element 3 is separately encapsulated using an encapsulating resin or the like and therefore, a reduction in the costs and the number of processes can be achieved.

Figure 4:
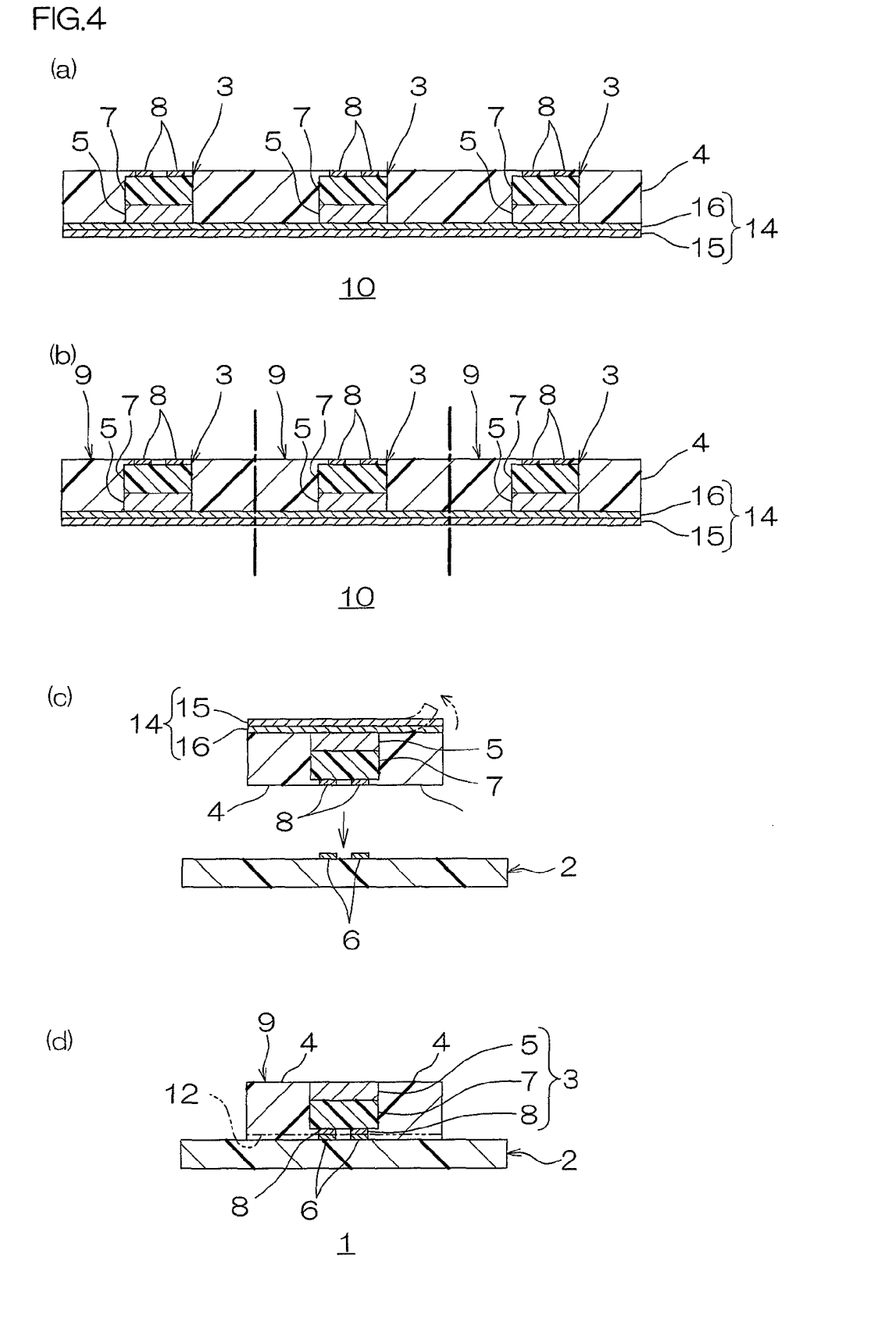

FIG. 4 shows process drawings for illustrating a method for producing the light emitting diode device 1 shown in FIG. 1.

Next, a method for producing the light emitting diode device 1 using the above-described light emitting element transfer sheet 10 is described with reference to FIG. 4.

In this method, as shown in FIG. 4 (a), the light emitting element transfer sheet 10 produced by the above-described method (the above-described method shown in FIGS. 3 (a) to 3 (d)) is first prepared.

Next, in this method, as shown in FIG. 4 (b), the light emitting element transfer sheet 10 is divided into a plurality (for example, three pieces) of the single pieces 9, each of which includes at least one piece of the light emitting element 3 (one piece in FIG. 4 (a)).

In this process, as described above, the single piece 9 includes the light emitting element 3 and the reflecting resin layer 4 that encapsulates the light emitting element 3, and is supported by the release substrate 14.

Next, in this method, as shown in FIG. 4 (c), the diode board 2 provided with the terminal 6 is prepared and the single piece 9 is disposed in opposed relation to the diode board 2 in the thickness direction.

The electrode portion 8 of the light emitting element 3 is electrically connected to the terminal 6 of the diode board 2 and the light emitting element 3 is flip-chip mounted on the diode board 2 (ref: an arrow in solid line).

In this process, when the resin of the reflecting resin layer 4 is made of the thermosetting resin, the reflecting resin layer 4 is in a B-stage state, so that the single piece 9 and the diode board 2 are subjected to pressure bonding in the thickness direction and in this way, the reflecting resin layer 4 is filled in the lower space 12 (ref: the phantom line) at the lower side of the light semiconductor layer 7.

Thereafter, the adhesion of the pressure-sensitive adhesive layer 16 in the release substrate 14 is reduced, for example, by being heated and the release substrate 14 is peeled off from the single piece 9, so that the light emitting element 3 and the reflecting resin layer 4 are transferred onto the diode board 2 (ref: the arrow in dashed line).

The reflecting resin layer 4 in a B-stage state is heated to be cured as required.

In this way, as shown in FIG. 4 (d), the light emitting diode device 1 can be obtained.

In the light emitting diode device 1 and the producing method thereof, the above-described light emitting element transfer sheet 10 is used, so that the light emitted from the light semiconductor layer 7 is reflected by the light reflecting component of the reflecting resin layer 4 before being absorbed by another member. As a result, the extraction efficiency of the light can be improved.

In the light emitting diode device 1 and the producing method thereof, the phosphor layer 5, which is formed in a sheet state, is prepared in advance, so that the phosphor layer 5 can be easily formed to be thin in a short time. Therefore, the increase in the production costs can be suppressed.

In the light emitting diode device 1 and the producing method thereof, the reflecting resin layer 4 can be successfully filled in the lower space 12 at the lower side of the light semiconductor layer 7 by the reflecting resin layer 4.

In the light emitting diode device 1 and the producing method thereof, the light emitting element 3 can be encapsulated by the reflecting resin layer 4, so that it is not required that the light emitting element 3 is separately encapsulated using the encapsulating resin or the like and therefore, the reduction in the costs and the number of processes can be achieved.

EXAMPLES

Example 1

Production of Light Emitting Element Transfer Sheet

A light semiconductor layer (a light semiconductor sheet), which includes a light semiconductor layer including a buffer layer (GaN), an N-type semiconductor layer (n-GaN), a light emitting layer (InGaN), and a P-type semiconductor layer (p-GaN:Mg) and an electrode portion including an anode electrode and a cathode electrode, having a thickness of 0.2 mm and a maximum length of 100 mm expanding in a sheet state, was prepared.

Next, a phosphor layer was laminated on the top surface of the light semiconductor layer (the light semiconductor sheet).

To be specific, 26 parts by mass of phosphor particles composed of $Y_3Al_5O_{12}$:Ce (in a sphere shape, the average particle size of 8 μm) and 74 parts by mass of a silicone resin (addition reaction type silicone resin, kinetic viscosity (at 25° C.) of 20 $mm^2$/S, manufactured by WACKER ASAHIKASEI SILICONE CO., LTD.) were blended and stirred uniformly, so that a phosphor composition was prepared.

Next, the prepared phosphor composition was applied onto the top surface of the light semiconductor layer by a printing to form a phosphor film. Thereafter, the phosphor film was dried at 100° C. to form the phosphor layer. In this way, a light emitting element sheet was obtained (ref: FIG. 3 (a)).

Next, the light emitting element sheet was divided (subjected to a dicing process) into plural pieces, so that a plurality of light emitting elements, each of which includes the electrode portion, the light semiconductor layer, and the phosphor layer, were formed (ref: dashed lines in FIG. 3 (a)).

Next, a plurality of the light emitting elements were disposed at spaced intervals to each other on a release substrate in which the upper surface and the lower surface thereof were formed into a flat state made of a fluorine resin having a thickness of 50 μm so that the phosphor layer was opposed to the release substrate (ref: FIG. 3 (b)).

Next, a reflecting resin composition was prepared and the reflecting resin composition was printed on the release substrate, so that a reflecting resin layer in a B-stage state covering the light emitting element was formed (ref: FIG. 3 (c)).

100 parts by mass of thermosetting silicone resin and 20 parts by mass of a particle of titanium oxide ($TiO_2$: tetragonal system of rutile) in a sphere shape having an average particle size of 300 nm were uniformly mixed, so that the reflecting resin composition was prepared.

Next, the reflecting resin layer was partially removed by an etching so that one side surface in a thickness direction of the electrode portion was exposed from the reflecting resin layer (ref: FIG. 3 (d)).

Thereafter, the reflecting resin layer was cured by being heated, so that a light emitting element transfer sheet was obtained.

Example 2

The light emitting element transfer sheet obtained in Example 1 (ref: FIG. 4 (a)) was divided into a plurality of single pieces, each of which included at least one piece of the light emitting element, and a plurality of the release substrates supporting the single pieces (ref: FIG. 4 (b)).

Next, the obtained single piece was disposed in opposed relation to a diode board having a thickness of 1 mm in the thickness direction and the light emitting element was flip mounted (flip mounting is also called flip-chip mounting) on the upper surface of the diode board (ref: FIG. 4 (c)). The diode board included an insulating board made of sapphire and a conductive layer including a terminal made of copper, nickel, and gold on the upper surface thereof.

In this way, a light emitting diode device was obtained (ref: FIG. 4 (d)).

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a light emitting element transfer sheet comprising:
   a first step of preparing a light emitting element sheet including a light semiconductor layer connected to an electrode portion on one side surface in a thickness direction thereof and a phosphor layer laminated on the other side surface in the thickness direction of the light semiconductor layer so as to be in contact with the other side surface;
   a second step of dividing the light emitting element sheet into plural pieces to form a plurality of light emitting elements, each of which includes the electrode portion, the light semiconductor layer, and the phosphor layer after the first step;

a third step of disposing a plurality of the light emitting elements on a release substrate to be spaced apart from each other so that the phosphor layer is in contact with the release substrate after the second step;

a fourth step of forming a reflecting resin layer containing a light reflecting component on the release substrate so as to cover the light emitting elements after the third step; and a fifth step of removing the reflecting resin layer partially so that one side surface in the thickness direction of the electrode portion is exposed from the reflecting resin layer after the fourth step.

2. A method for producing a light emitting device comprising the steps of:

producing a light emitting element transfer sheet by a method for producing a light emitting element transfer sheet including:

a first step of preparing a light emitting element sheet including a light semiconductor layer connected to an electrode portion on one side surface in a thickness direction thereof and a phosphor layer laminated on the other side surface in the thickness direction of the light semiconductor layer so as to be in contact with the other side surface;

a second step of dividing the light emitting element sheet into plural pieces to form a plurality of light emitting elements, each of which includes the electrode portion, the light semiconductor layer, and the phosphor layer after the first step;

a third step of disposing a plurality of the light emitting elements on a release substrate to be spaced apart from each other so that the phosphor layer is in contact with the release substrate after the second step;

a fourth step of forming a reflecting resin layer containing a light reflecting component on the release substrate so as to cover the light emitting elements after the third step; and a fifth step of removing the reflecting resin layer partially so that one side surface in the thickness direction of the electrode portion is exposed from the reflecting resin layer after the fourth step, dividing the light emitting element transfer sheet into a plurality of single pieces, each of which includes at least one piece of the light emitting element;

allowing the single piece to be disposed in opposed relation to a base board including a terminal in a thickness direction, and the electrode portion to be electrically connected to the terminal, so that the light emitting element is flip-chip mounted on the base board, and releasing the release substrate from the single piece.

3. A light emitting element transfer sheet comprising:

a release substrate;

a plurality of light emitting elements including a light semiconductor layer, an electrode portion connected to one side surface in a thickness direction of the light semiconductor layer, and a phosphor layer laminated on the other side surface in the thickness direction of the light semiconductor layer so as to be in contact with the other side surface, and disposed on the release substrate to be spaced apart from each other so that the phosphor layer is in contact with the release substrate; and a reflecting resin layer containing a light reflecting component and on the release substrate, covering the light emitting elements and exposing one side surface in the thickness direction of the electrode portion.

4. A light emitting device comprising:

a single piece obtained by dividing a light emitting element transfer sheet, including a release substrate;

a plurality of light emitting elements including a light semiconductor layer, an electrode portion connected to one side surface in a thickness direction of the light semiconductor layer, and a phosphor layer laminated on the other side surface in the thickness direction of the light semiconductor layer so as to be in contact with the other side surface, and disposed on the release substrate to be spaced apart from each other so that the phosphor layer is in contact with the release substrate; and a reflecting resin layer containing a light reflecting component and on the release substrate, covering the light emitting elements and exposing one side surface in the thickness direction of the electrode portion, into plural pieces, including at least one piece of a light emitting element, to be disposed in opposed relation to a base board including a terminal in a thickness direction, and an electrode portion to be electrically connected to the terminal, so that the light emitting element is flip-chip mounted on the base board.

* * * * *